United States Patent
Patel

(10) Patent No.: US 6,750,663 B2
(45) Date of Patent: Jun. 15, 2004

(54) METHOD AND SYSTEM FOR CONDUCTING CONTINUITY TESTING ON ANALOG DEVICES HAVING SENSITIVE INPUT NODES

(75) Inventor: Gunvant Patel, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/032,982

(22) Filed: Dec. 28, 2001

(65) Prior Publication Data

US 2003/0122559 A1 Jul. 3, 2003

(51) Int. Cl.[7] .......................... G01R 27/08; G01R 19/00
(52) U.S. Cl. ..................... 324/713; 324/522; 324/73.1; 324/158.1; 330/2; 330/69
(58) Field of Search ................. 330/2, 73, 69; 324/522, 525, 601, 617, 647, 691, 692, 693, 712, 73.1

(56) References Cited

U.S. PATENT DOCUMENTS

| | | | |
|---|---|---|---|
| 3,581,198 A | * 5/1971 | Shoemaker et al. | ....... 324/73.1 |
| 3,718,857 A | * 2/1973 | Bernard | ....................... 324/617 |
| 4,088,947 A | * 5/1978 | Farmer, Jr. | ................... 324/556 |
| 4,228,394 A | * 10/1980 | Crosby | ........................ 324/712 |

* cited by examiner

*Primary Examiner*—N. Le
*Assistant Examiner*—Vincent Q. Nguyen
(74) *Attorney, Agent, or Firm*—Frederick J. Telecky, Jr.; W. James Brady, III

(57) ABSTRACT

The present invention provides for a method (30) and system (10) for isolating the input nodes (3, 4) and/or the output nodes (5, 8) of an analog device (12) and performing continuity testing thereof without using relays. The system includes an analog device having a pair of input and output terminals and a plurality of resistors (R1-R3 and R4-R6) arranged in parallel and connected thereto. The method for testing continuity of the analog device includes providing a voltage input via at least one of the resistors to either input node, and then measuring the voltage at the same node via a resistor. If a diode drop from ground is sensed there is continuity, and if the applied voltage is sensed at the node there is not continuity. As a result, the invention advantageously isolates the nodes and removes any unwanted capacitance and impedance loading thereon during testing thereof. The invention also allows multiple node testing to be performed simultaneously in parallel, which reduces testing time and permits direct testing on the nodes without the use of external circuit relays.

21 Claims, 2 Drawing Sheets

METHOD AND SYSTEM FOR CONDUCTING CONTINUITY TESTING ON ANALOG DEVICES HAVING SENSITIVE INPUT NODES

FIELD OF THE INVENTION

The present invention relates to analog device testing, and more particularly, to a method and system for performing circuit continuity testing of analog devices having sensitive input nodes.

BACKGROUND OF THE INVENTION

Generally, an analog device, such as a operational amplifier, has multiple input terminals, also known as input nodes, that are adapted to receive voltage or current signals. Typically, when a continuity test of the device is performed, additional capacitive or impedance loading is realized at the nodes. The nodes themselves are sensitive and any additional loading during testing will often cause the device to lose its functionality.

One conventional method of testing for circuit continuity of an analog device having sensitive input and output nodes has been to isolate the nodes from the test equipment 12 using external relays 14, 16, as illustrated in FIG. 1. These relays isolate the respective device nodes from any external capacitance or impedance created when the nodes are directly coupled to test instrument 12. However, this technique becomes inadequate when multi-site testing of the analog device is conducted, wherein typically 2 to 32 analog devices are tested in parallel, and thus, the number of relays needed to properly isolate the nodes becomes unreasonable.

Accordingly, there exists a need for a method and system that effectively isolates the input and output nodes of the analog device when a continuity test is performed, thereby eliminating the negative effects of any additional impedance and capacitance loading thereon during testing. Furthermore, such a method or system would allow for parallel testing at the nodes without the use of external isolation relays.

SUMMARY OF THE INVENTION

The present invention provides technical advantages as a method and system of isolating the input and output nodes of an analog device with resistors during a continuity test without using numerous relays. In isolating the nodes and removing the unwanted capacitance and impedance loading thereon, the invention allows simultaneous testing of multiple nodes to be performed in parallel. This reduces testing time and permits direct testing on the nodes of multiple devices without the use of external circuit relays.

In one preferred embodiment, the invention is a method of performing an internal circuit continuity test on an analog device that has a pair of input terminals comprising input nodes. Each of these input nodes are coupled to respective input terminals and separate respective output terminals of a receiving testing circuit comprising a plurality of resistors configured in parallel. The method is achieved, first, by providing a first voltage input via a resistor to the first input of the receiving circuit which responsively produces a voltage drop sensed at the first output terminal. The node voltage is then measured by the testing device connected to the first input. A diode voltage drop sensed at the first input is indicative of the internal circuit continuity of the analog device. Conversely, sensing the applied voltage is indicative of no continuity. This method is repeated for each input and output node, simultaneously, to allow expedited testing of all nodes in parallel, without relays.

In another embodiment, the invention is a system that has an analog device such as a differential amplifier, which has a first and second input terminal, forming a first and second input node, respectively, and a pair of output terminals. The system has a test interface first input comprising a first resistor which is connected to the first node and is adapted to provide an input voltage. A test interface first output includes a second resistor, also connected to the first node, that receives a voltage output responsive to the applied input voltage that is indicative of the internal circuit continuity of the analog device. A voltage drop is sensed at the test interface first output due to a diode clamp circuit located therein. The voltage output is measured via the second resistor with a testing device, such as voltage or current meter. This testing structure, providing a separate resistor isolated input and output for each node under test, allows multiple nodes to be tested simultaneously, in parallel, without relays.

BRIEF DESCRIPTION OF THE DRAWINGS

Advantages of the invention and the specific embodiments will be understood by those of ordinary skill in the art by reference to the following detailed description of preferred embodiments taken in conjunction with the drawings, in which.

DETAILED DESCRIPTION OF THE PREFERRED EMBODIMENTS

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Figure 2:
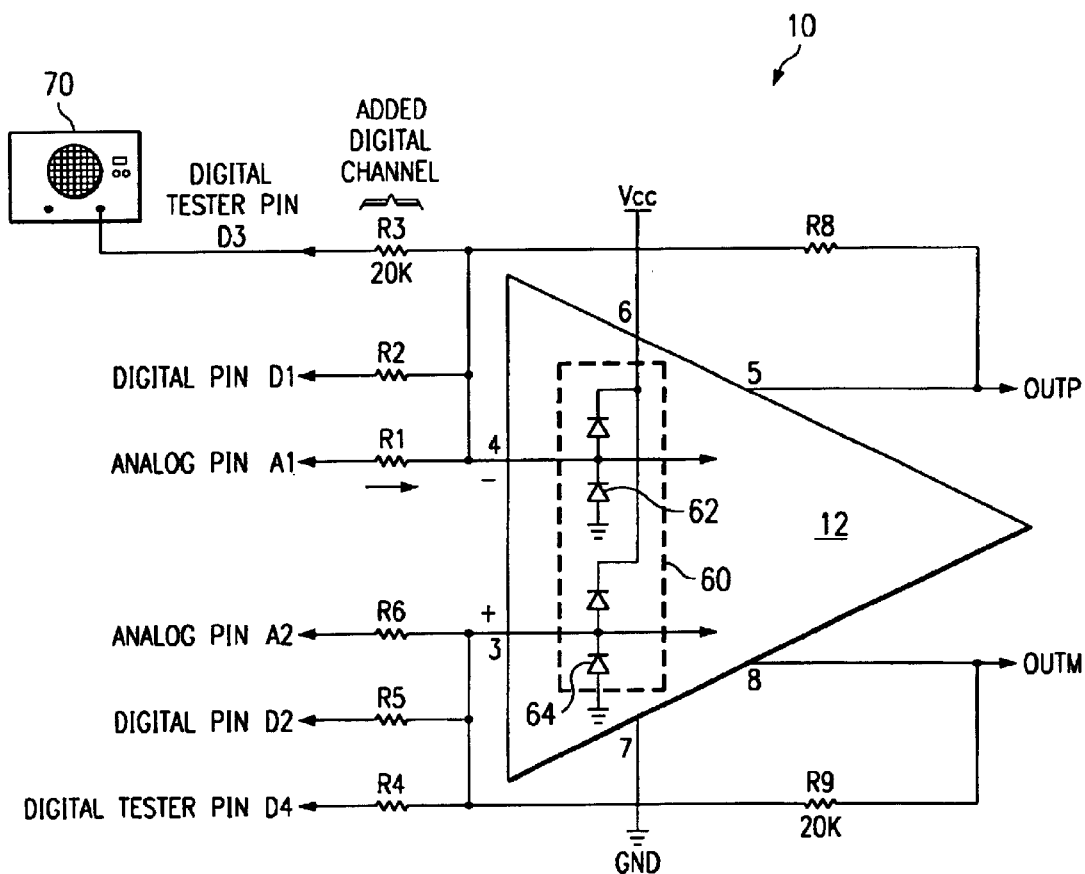
FIG. 2 shows an differential amplifier having two input nodes having a plurality of parallel isolation resistors coupling the external test equipment thereto in accordance with the present invention.

Referring now to FIG. 2, a system 10 is shown having an analog device embodied as differential amplifier 12 having a pair of input terminals comprising nodes 3 and 4 coupled to test equipment 70 via a testing interface comprising a plurality of resistors configured in parallel. Each input node has a respective set of parallel resistors coupled thereto in accordance with the present invention. The differential amplifier 12 is seen having its inverting terminal 4 coupled to a first set of resistors R1, R2, and R3, with each resistor being configured in parallel. The first resistor R1 couples an analog pin A1 to node 4, resistor R2 couples a digital pin D1 to node 4, and resistor R3 couples the node 4 to digital pin D3 which is coupled to test equipment 70. Likewise, a second set of resistors R4, R5, and R6 are also seen to be arranged in parallel and coupled to the non-inverting terminal 3 of differential amplifier 12. Resistor R4 couples node 3 to digital pin D4 which is also coupled to test equipment 70, resistor R5 couples node 3 to a digital pin D2, and resistor R6 couples analog pin A2 to node 3. In addition, a feedback circuit comprising resistors R8 and R9 are coupled in a feedback loop from the output node 5 and 8 to input nodes 4 and 3, respectively. The differential amplifier 12 receives operational power from Vcc at node 6 and is referenced to ground at node 7.

The differential amplifier 12 has therein a diode protection 60 circuit directly coupled between each node 3 and 4 and Vcc and ground. The diode protection circuit 60 includes diodes 62 and 64 having their nodes coupled to ground which function as voltage "clamps" to internally clamp the voltage at either node 3 or 4, respectively, to one diode voltage drop below ground when a negative voltage is applied to the respective node via analog pins A1 and A2.

Figure 1:
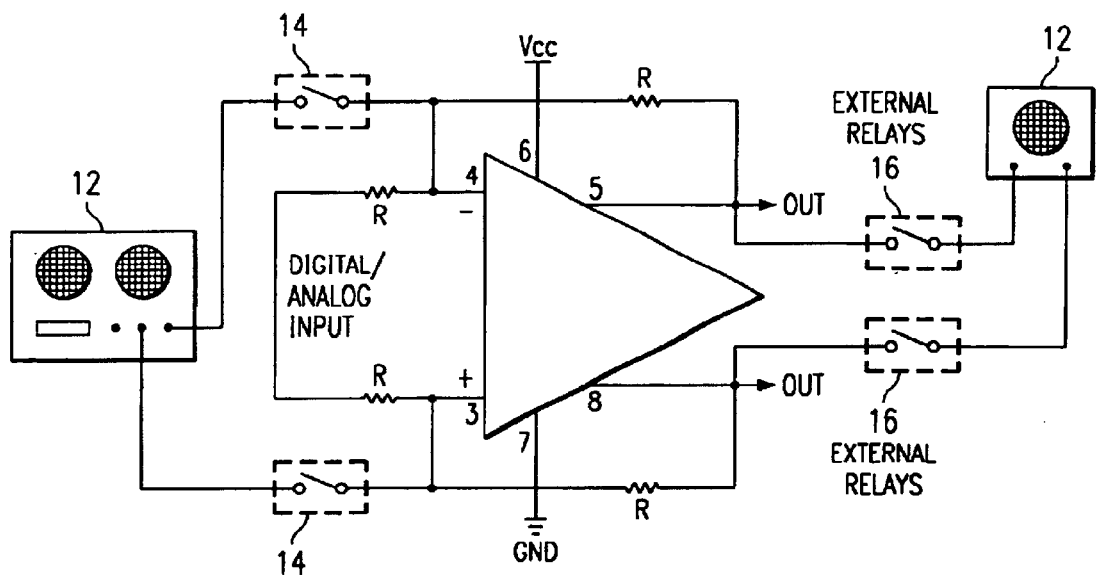
FIG. 1 show a differential amplifier having dual input and output terminals with an external testing circuit coupled thereto in accordance with the prior art.
Figure 3:
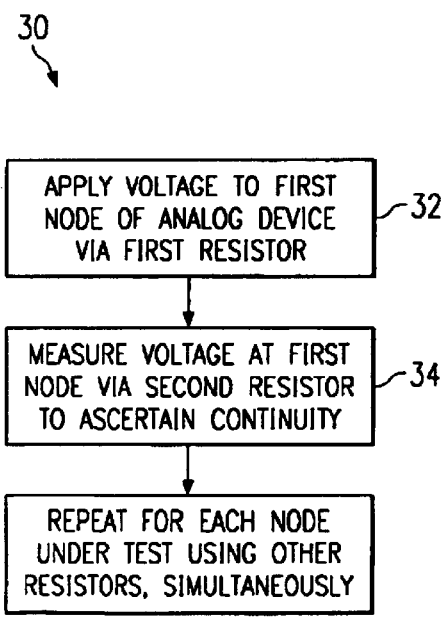
FIG. 3 illustrates a continuity test algorithm according to the present invention.

Referring now to FIG. 3, there is shown a continuity test algorithm 30. Initially, when a continuity test is conducted on the differential amplifier 12, as illustrated in FIG. 2, a voltage applying act 32 is executed wherein a negative voltage is applied by test equipment 70 via input A1, which is then applied across resistors R1, and received by the differential amplifier 12 at node 4.

Thereafter, the voltage sensing act 34 is performed, whereby pin D3 is utilized by the testing equipment 70 to sense the voltage at the node under test. The current received at node 4, for example, which is the inverting input of the differential amplifier 12, is as follows:

$$I = (V_{A1} - V_{DUT4})/20K$$

Here, $V_{A1}$ equals the voltage amplitude of input signal at A1, comprising a digital or analog signal. $V_{DUT4}$ equals the voltage at node 4, which is a diode drop 0.7 v below ground due to the biasing of the respective clamp diode 62.

In operation, for example, when a −2.0 Volts input signal is applied at input A1, the current and voltage realized at node 4 will be 100 μa and −0.7 v, respectively. Preferably, to avoid a bias breakdown of the diode 62, the current level conducted through the diode 62 is kept small by applying a low amplitude input signal voltage across resistor R1. The internal circuit continuity is confirmed by sensing a voltage drop occurring across diode 62, that is, sensing a −0.7 v voltage at the respective node. If, on the other hand, the applied −2.0 volts is also sensed at the node, and not the −0.7 v due to a voltage drop, no continuity is determined. Likewise, if an input signal is provided at input A2, then the differential amplifier 12 is said to have achieved continuity at node 3 when a voltage drop across diode 64 is realized, by sensing a −0.7 v voltage thereat. The ground and Vcc pin are grounded during testing to avoid floating this pin and other internal connected components.

Here, the testing device 70 is coupled to input D3. Advantageously, since no voltage is applied at input D3, no voltage drop is achieved across resistors R3 and no current is conducted through isolation resistor R3. Advantageously, resistor R3 isolates node 4 without using relays preventing testing device 70 from reading noise, static, or other errors when the voltage at the node measured. As noted earlier, the voltage drop across diode 62 is measured at the node to determine the circuit continuity of the differential amplifier 12.

The output nodes 5 and 8 also have a similar diode clamp protection scheme, and continuity can be determined thereat using this technique. Sensing a voltage drop below ground at each node under test conforms continuity thereat, and sensing the applied voltage at any node confirms no continuity.

It should be understood that although a differential amplifier is shown, continuity testing, as described herein, may be performed on any type of analog device, having diode clamping components, and, as such, any limitation on the type of analog device that may be used is not to be inferred.

One advantage of the present invention is that a cleaner input voltage reading across any of the differential amplifier's input or output nodes may be realized, since the invention effectively removes capacitance and impedance loading that is often created when these nodes are directly coupled to the testing device 70.

Moreover, the invention advantageously offers the added advantage of allowing continuity testing to be simultaneously performed on these sensitive input nodes with multiple parallel resistors coupled thereto. Thus, the invention reduces the time that is needed to test the differential amplifier 12 for circuit continuity, and also advantageously eliminates the need for external circuit relays which are conventionally used to isolate the nodes during device testing.

Though the invention has been described with respect to specific preferred embodiments, many variations and modifications will become apparent to those skilled in the art upon reading the present application. It is therefore the intention that the appended claims be interpreted as broadly as possible in view of the prior art to include all such variations and modifications.

What is claimed is:

1. A method of conducting a circuit continuity test on an analog device having a first and a second node, said first and second node being coupled to a test circuit having a plurality of inputs, comprising the steps of:
   providing a first voltage via a first resistor to said first node using a first input of said test circuit, wherein said first node couples to a diode in the analog device, said diode connecting said first node directly to ground; and
   measuring a second voltage at the first node via a second input of said test circuit,
   wherein said measured second voltage and corresponding operational state of said diode is indicative of the internal circuit continuity of said analog device.

2. The method of claim 1 wherein said measured second voltage is a diode drop below ground when the analog device first node has continuity.

3. The method of claim 2 wherein the measured second voltage is the applied said first voltage when said analog device first node does not have continuity.

4. The method of claim 1 wherein said second voltage is measured at said first node without using a relay.

5. The method of claim 1 wherein said second voltage is measured via a second resistor being in parallel with said first resistor.

6. The method of claim 1 wherein said first voltage is negative voltage.

7. The method of claim 2 further comprising the step of simultaneously applying a third voltage to said second input node via a third resistor, and measuring a fourth voltage at said second node.

8. The method of claim 1 wherein said analog device is an operational amplifier.

9. A device, comprising:
   an analog device having a first and second input node and including an internal diode coupled to said first node, said internal diode coupling said first node directly to ground;
   a first external circuit coupled to said first node, said first circuit providing a first voltage via a first resistor; and a second external circuit coupled to said first node without using a relay, said second circuit sensing a second voltage thereat via a second resistor, said second voltage and the corresponding operational state of said diode being indicative of the internal continuity of said analog device first node.

10. The device as recited in claim 9, wherein said second circuit is coupled to and isolated from said first node via a second resistor.

11. The device as recited in claim 9 wherein said second voltage produced at said first node is indicative of the voltage drop of said diode when the first node has continuity.

12. The device as recited in claim 9 wherein second circuit comprises a testing device, wherein said testing device is capable of measuring said second voltage produced at said first node.

13. The device as recited in claim 9 wherein said first voltage is a negative voltage.

14. The device as recited in claim 9 wherein said analog device is a differential amplifier.

15. The device as recited in claim 10 wherein said first and second resistors have the same value.

16. In combination
   an analog device having a first and second input terminal comprising a first and second node and a pair of output terminals;
   a first resistor coupled to said first node, and first resistor receiving a first input voltage;
   a second resistor coupled to said first node;
   a third resistor coupled to the said second node, said third resistor receiving a second input voltage;
   a fourth resistor coupled to said second node; and
   wherein said second resistor and said fourth resistor communicate to a testing device a voltage at said first node and said second node, respectively, that is indicative of the internal circuit continuity of said analog device.

17. The device as recited in claim 16 wherein said analog device includes an internal diode coupled to said first node, and said voltage output across said second resistor is used to determine a voltage drop across said diode.

18. The device as recited in claim 16 wherein said first input voltage comprises a negative voltage.

19. The device as recited in claim 16 wherein said analog device is configured as a differential amplifier.

20. The device as recited in claim 17, wherein said testing device measures the voltage drop across said diode.

21. The device as recited in claim 16 wherein said analog device has a pair of feedback circuits each providing feedback, one said feedback circuit being coupled between each said output terminal and one said respective input terminal.

* * * * *